US006204693B1

(12) United States Patent
Förster et al.

(10) Patent No.: US 6,204,693 B1
(45) Date of Patent: Mar. 20, 2001

(54) APPARATUS FOR REGULATING THE FLOW OF CURRENT THROUGH A LOAD

(75) Inventors: Ralf Förster, Regensburg; Alfons Fisch, Falkenstein, both of (DE)

(73) Assignee: Siemens Aktiengesellschaft, Munich (DE)

( * ) Notice: Subject to any disclaimer, the term of this patent is extended or adjusted under 35 U.S.C. 154(b) by 0 days.

(21) Appl. No.: 09/412,063

(22) Filed: Oct. 4, 1999

Related U.S. Application Data

(63) Continuation of application No. PCT/DE98/00799, filed on Mar. 18, 1998.

(30) Foreign Application Priority Data

Apr. 4, 1997 (DE) ........................................ 197 13 981

(51) Int. Cl.$^{7}$ ........................................ H03K 19/018
(52) U.S. Cl. ........................................ 326/89; 123/644
(58) Field of Search ........................................ 123/644; 326/89, 326/90

(56) References Cited

U.S. PATENT DOCUMENTS 5,043,633 * 8/1991 Perkins ........................................ 123/644
5,775,310 * 7/1998 Ito et al. ........................................ 123/644
5,970,964 * 10/1999 Furuhata et al. ........................................ 123/644
6,100,728 * 8/2000 Shreve et al. ........................................ 327/110

FOREIGN PATENT DOCUMENTS

3826663A1 2/1990 (DE) .
3908558C2 12/1990 (DE) .
4005813A1 8/1991 (DE) .
4231954A1 3/1994 (DE) .
195 11 140A1 10/1996 (DE) .
0281528A1 9/1988 (EP) .
0428315A2 5/1991 (EP) .
05079436A 3/1993 (JP) .
08028415A 1/1996 (JP) .

* cited by examiner

*Primary Examiner*—Michael Tokar
*Assistant Examiner*—Don Phu Le
(74) *Attorney, Agent, or Firm*—Herbert L. Lerner; Laurence A. Greenberg; Werner H. Stemer

(57) ABSTRACT

An apparatus is described for regulating the flow of current through a load in which the flow of current is monitored in the form of a reference voltage by an analog input and a digital input of an arithmetic and logic unit. The voltage measured at the analog input is used to regulate the flow of current. The voltage measured at the digital input either as a low or as a high signal is used to switch off the flow of current when there is a low signal.

7 Claims, 2 Drawing Sheets

APPARATUS FOR REGULATING THE FLOW OF CURRENT THROUGH A LOAD

CROSS-REFERENCE TO RELATED APPLICATION

This is a continuation of copending International Application PCT/DE98/00799, filed Mar. 18, 1998, which designated the United States.

BACKGROUND OF THE INVENTION

Field of the Invention

The invention relates to an apparatus for regulating the flow of current through a load which is connected to ground via a measurement line. A current is output onto an output line by a device connected to the measurement line which depends on the measured voltage on the measurement line. In a more specific embodiment, the invention relates to an apparatus for regulating the flow of current through a load connected between a positive potential and a first measurement resistor which is connected to ground via a measurement line. A current is output on an output line in dependence on a voltage measured on the measurement line and the output line is connected to a predetermined potential via a second measurement resistor.

German patent DE39 08 558 discloses a signal transmission system in which an analog signal and a digital signal are transmitted to a receiver from a transmitter via a data line. In the receiver, the analog signal and the digital signal are evaluated independently of one another.

German published patent application DE38 26 663 A1 discloses a method and a circuit for simultaneously transmitting operational data, in which operational data and voice signals are transmitted via a line. In that context, the peak values of the operational data are chosen to be higher than the maximum peak values of the voice signals so that the signals can be mixed and the operational data can be recovered from the voice signal using a comparison voltage at the reception location. The voice signal is obtained by subtracting the selected operational data from the mixed signal.

German published patent application DE195 11 140 A1 discloses an apparatus for serial data interchange between two stations via a common data transmission line. The first station recognizes the different bit states on the data line by their different voltage levels. The second station recognizes the different bit states on the data transmission line by the presence or absence of a particular flow of current. The voltage levels are evaluated differently by the stations, so that data can be transmitted in both directions at the same time.

German published patent application DE40 05 813 A1 describes an apparatus for regulating the flow of current through a load. The load is connected in series with a transistor and a measurement resistor. The voltage drop which the load current causes across the measurement resistor is compared with a reference voltage using an operational amplifier. If the voltage drop across the measurement resistor is more than a predetermined value, then an output signal is output which is used to control the load current.

SUMMARY OF THE INVENTION

It is accordingly an object of the invention to provide a device for regulating the current flow through a consumer, which overcomes the above-mentioned disadvantages of the heretofore-known devices and methods of this general type and which is of simple design and enables precise and simple regulation of the flow of current.

With the foregoing and other objects in view there is provided, in accordance with the invention, an apparatus for regulating a flow of current through a load, comprising:

a measurement line connecting a load to ground;

a current source connected to the measurement line and to an output line, the current source outputting a current onto the output line in dependence on a voltage on the measurement line; an arithmetic and logic unit having an analog input and a digital input each connected to the output line;

a switch connected to the arithmetic and logic unit;

the arithmetic and logic unit determining a value of the voltage on the output line via the analog input and, depending on the voltage determined via the analog input, regulating the flow of current through the load via the switch;

the arithmetic and logic unit determining the voltage on the output line via the digital input and deciding whether there is a low signal; and the arithmetic and logic unit, if there is a low signal at the digital input, opening the switch in a predeterminable time range and thereby interrupting the flow of current through the load.

With the above objects in view there is also provided, in accordance with the invention, an apparatus for regulating a flow of current through a load connected between a positive potential and a first measurement resistor connected to ground via a measurement line, comprising:

a first current source connected to a measurement line and to an output line connected to a predetermined potential via a second measurement resistor, the current source outputting a first current onto the output line in dependence on a voltage on the measurement line;

a second current source connected to the measurement line and to the output line, the second current source outputting a second current onto the output line if the voltage on the measurement line is lower than a predetermined limit value, the second current having a value causing a voltage on the output line to fall below a predetermined value;

an arithmetic and logic unit having an analog input and a digital input each connected to the output line;

a second switch connected to the arithmetic and logic unit and inserted between the load and the measurement line;

the arithmetic and logic unit determining a value of the voltage on the output line via the analog input, and controlling the second switch in dependence on the voltage determined via the analog input and thereby regulating a flow of current through the load;

the arithmetic and logic unit determining the voltage on the output line via the digital input to decide whether there is a low signal; and if there is a low signal at the digital input, the arithmetic and logic unit opening the second switch in a predeterminable time range and thereby interrupting the flow of current through the load.

In accordance with an added feature of the invention, the (first) current source is a voltage-dependent current source.

In accordance with an additional feature of the invention, the second current source comprises an operational amplifier having a first input connected to the measurement line, a second input connected to a constant voltage source, and an output, a first switch connected to the output of the operational amplifier and between the output line and ground, the operational amplifier comparing the voltage on the measurement line with a reference voltage of the constant voltage source and opening the first switch if the voltage on the measurement line is lower than the reference voltage, and closing the first switch if the voltage on the measurement line is higher than the reference voltage.

In accordance with a concomitant feature of the invention, the load is an ignition coil protected against overcurrent by the arithmetic and logic unit.

Other features which are considered as characteristic for the invention are set forth in the appended claims.

Although the invention is illustrated and described herein as embodied in an apparatus for regulating the flow of current through a load, it is nevertheless not intended to be limited to the details shown, since various modifications and structural changes may be made therein without departing from the spirit of the invention and within the scope and range of equivalents of the claims.

The construction and method of operation of the invention, however, together with additional objects and advantages thereof will be best understood from the following description of specific embodiments when read in connection with the accompanying drawings.

DESCRIPTION OF THE PREFERRED EMBODIMENTS

The invention is described below using the example of current regulation for a load in a motor vehicle. The use of the invention, however, is not restricted to the exemplary embodiment, but is applicable to any circuit configuration.

Figure 1:
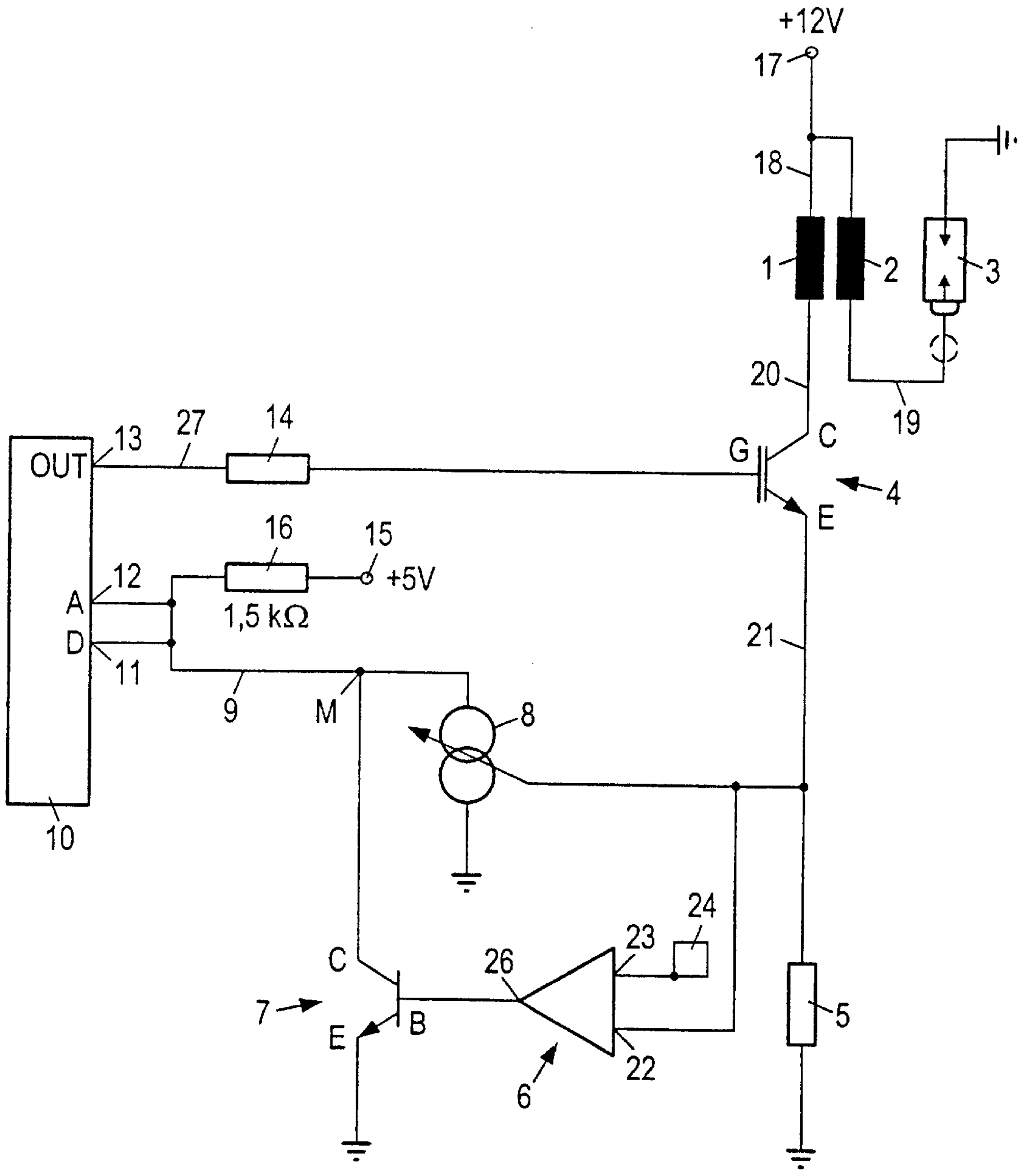
FIG. 1 is a schematic diagram of an apparatus for regulating the flow of current.

Referring now to the figures of the drawing in detail and first, particularly, to FIG. 1 thereof, there is seen an electronic circuit configuration for regulating the flow of current through a primary coil 1. The coil 1 represents a load, i.e. an electrical consumer. An input of the primary coil 1 is connected to a battery 17 via an input line 18. A secondary coil 2 is connected to the battery 17 in parallel with the primary coil 1. An output of the secondary coil 2 is connected via an ignition line 19 to a spark plug 3, whose output is in turn grounded. The spark plug 3 is arranged in the combustion chamber of an internal combustion engine.

The output of the primary coil 1 is connected via an output line 20 to the collector terminal C of a first transistor 4. The emitter terminal E of the transistor 4 is connected via a measurement line 21 to a first measurement resistor 5, which is connected to ground. The measurement line 21 is connected to the input of a voltage-dependent current source 8 whose output is connected to an output line 9. The measurement line 21 is additionally connected to a first input 22 of an operational amplifier 6. A second input 23 of the operational amplifier 6 is connected to a reference voltage source 24. In a preferred embodiment the reference voltage source 24 outputs a constant voltage. The output 26 of the operational amplifier 6 is connected to the base terminal B of a second transistor 7, whose emitter terminal E is connected to ground and whose collector terminal C is connected to an output line 9. The output line 9 is connected via a second measurement resistor 16 to a predetermined potential, in this case +5 V. In addition, an analog line runs from the output line 9 to an analog input 12 of an arithmetic and logic unit 10 (processor, microprocessor, controller, program subroutine, etc.), and a digital line runs from the output line 9 to a digital input 11 of the arithmetic and logic unit 10. The arithmetic and logic unit 10 has a control output 13 which is connected to the gate G of the first transistor 4 via a control line 27 and a first resistor 14.

Figure 2:
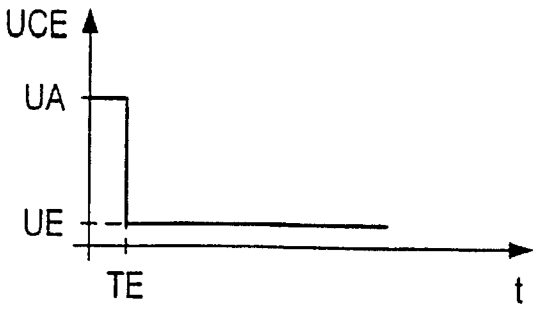
FIG. 2 is a graph showing a voltage curve on the measurement line.
Figure 3:
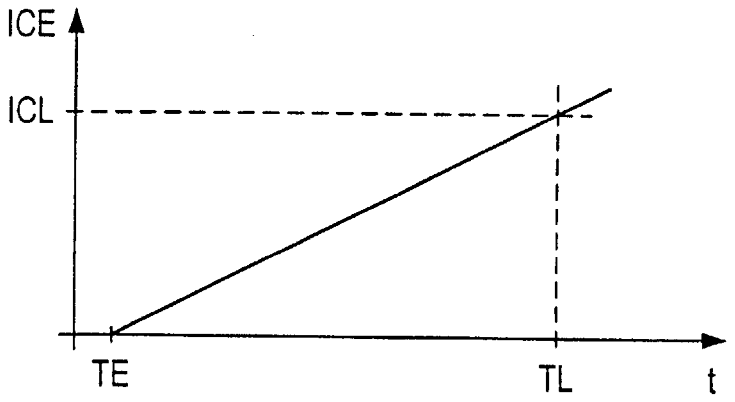
FIG. 3 is a graph showing a current waveform on the measurement line.
Figure 4:
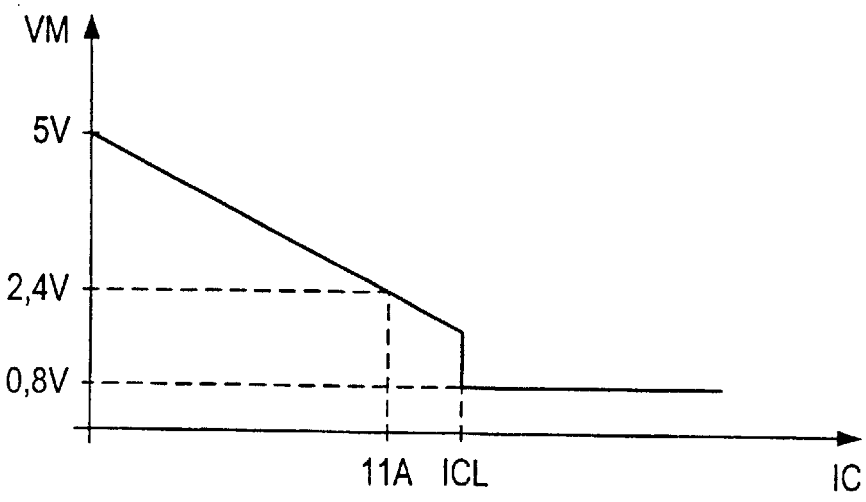
FIG. 4 is a graph showing a voltage VM on the output line as a function of the flow of current IC on the measurement line.

The functional operation of the circuit of FIG. 1 will now be explained in more detail with reference to FIGS. 2 to 4: to prepare to fire the spark plug 3, the arithmetic and logic unit 10 switches on the first transistor 4 at an instant TE. As a result, the current through the primary coil rises and the voltage drop between the collector terminal and the emitter terminal of the first transistor 4 falls from a first voltage UA to a second voltage UE at the instant TE. As a further result, a primary current ICE flows through the primary coil 1, starting at the instant TE and rising with time t (cf. FIG. 3).

This causes the voltage on the measurement line 21 to vary proportionally, so that the voltage-dependent current source 8 outputs a second current onto the output line 9. The second current is proportional to the primary current and rises linearly with time.

If the primary current is below a predetermined limit current ICL, then the voltage drop on the measurement line 21 also remains below a predetermined value. The operational amplifier 6 first switches on the second transistor 7 if the primary current exceeds the limit current ICL at the instant TL. This means that the voltage at the analog input 12 and at the digital input 11 reacts as a function of the primary current IC, as illustrated by the waveform shown in FIG. 4.

If a primary current is flowing and if the primary current is below the limit current ICL, then the voltage at the analog input 12 and at the digital input 11 falls proportionally from the predetermined potential of +5 V down to a value of just below 3 V. This voltage drop is caused by the second current, which is supplied by the voltage-dependent current source 8.

If the primary current IC now exceeds the predetermined limit value ICL, the operational amplifier 6 recognizes this because the voltage on the measurement line 21 rises above the voltage of the reference voltage source 24. As a result, the output 26 of the operational amplifier 6 drives the base terminal B of the second transistor 7, so that the second transistor 7 is switched on and hence a third current flows via the second transistor 7 and the output line 9. The second transistor 7 and the second resistor 16 are designed such that, when the second transistor 7 is switched on, the voltage on the output line 9 falls below a predetermined limit value, in this case 0.8 V. This is shown by 11A in FIG. 4 for the predetermined limit current ICL.

On the one hand, the arithmetic and logic unit 10 regulates the flow of current through the primary coil 1 using the transistor 4. At the same time, the arithmetic and logic unit monitors the flow of current through the primary coil 1 using an analog input 12 and a digital input 11. The analog input 12 is provided with an analog/digital converter which converts the voltage on the output line 9 into a corresponding digital value, which the arithmetic and logic unit 10 then uses to control the transistor 4.

At the same time, the arithmetic and logic unit 10 monitors the voltage at the digital input 11. If the voltage at the digital input 11 is in the high range, that is to say above 2.4 volts, then the arithmetic and logic unit 10 regulates the flow of current through the primary coil 1 using the voltage values which are received by the analog input 12.

If, however, the arithmetic and logic unit 10 recognizes that the digital input 11 has a low signal of below 0.8 V, then the arithmetic and logic unit 10, preferably at a calculated ignition instant, drives the first transistor 4 such that the flow of current through the primary coil 1 is interrupted and hence a high ignition voltage is produced in the secondary coil 2, so that the spark plug 3 fires.

The connection of an analog and a digital input 12, 11 to a single output line 9 has the advantage that the output line 9 can be used to transfer both analog information and digital information. The analog information is used to regulate the current level flowing through the primary coil 1, and the digital information is used to protect against overcurrent and to indicate that the primary coil 1 is sufficiently charged to fire the spark plug 3.

The analog information in the form of a voltage change on the output line 9 should be chosen such that the value range for a high signal and the value range for a low signal are adhered to, so that the analog information does not change the digital information from a high signal to a low signal or vice versa.

In addition, it is advantageous for an overcurrent to be monitored via a digital input 11, because the digital input 11 is sampled faster and more often than the analog input 12 and hence the primary current can be reduced quickly if an excessively large current occurs which could damage the primary coil 1.

The arithmetic and logic unit 10 "knows" the voltage value adopted by the digital signal in the high state and in the low state. The arithmetic and logic unit uses this to calculate the value of the analog signal from the voltage at the analog input 12. In addition, the analog signal is advantageously designed such that, if the analog and the digital signal overlap, the arithmetic and logic unit 10 always recognizes the value of the digital signal. The first transistor 4 represents a second switch and the second transistor 7 represents a first switch.

We claim:

1. An apparatus for regulating a flow of current through a load, comprising:

a measurement line connecting a load to ground;

a current source connected to said measurement line and to an output line, said current source outputting a current onto said output line in dependence on a voltage on said measurement line;

an arithmetic and logic unit having an analog input and a digital input each connected to said output line;

a switch connected to said arithmetic and logic unit;

said arithmetic and logic unit determining a value of the voltage on said output line via said analog input and, depending on the voltage determined via said analog input, regulating the flow of current through the load via said switch;

said arithmetic and logic unit determining the voltage on said output line via said digital input and deciding whether there is a low signal; and said arithmetic and logic unit, if there is a low signal at said digital input, opening said switch in a predeterminable time range and thereby interrupting the flow of current through the load.

2. The apparatus according to claim 1, wherein said current source is a voltage-dependent current source.

3. The apparatus according to claim 1, wherein the load is an ignition coil protected against overcurrent by said arithmetic and logic unit.

4. Apparatus for regulating a flow of current through a load connected between a positive potential and a first measurement resistor connected to ground via a measurement line, comprising:

a first current source connected to a measurement line and to an output line connected to a predetermined potential via a second measurement resistor, said current source outputting a first current onto said output line in dependence on a voltage on the measurement line;

a second current source connected to the measurement line and to said output line, said second current source outputting a second current onto said output line if the voltage on the measurement line is lower than a predetermined limit value, the second current having a value causing a voltage on the output line to fall below a predetermined value;

an arithmetic and logic unit having an analog input and a digital input each connected to the output line;

a second switch connected to said arithmetic and logic unit and inserted between the load and the measurement line;

said arithmetic and logic unit determining a value of the voltage on the output line via said analog input, and controlling said second switch in dependence on the voltage determined via said analog input and thereby regulating a flow of current through the load;

said arithmetic and logic unit determining the voltage on the output line via said digital input to decide whether there is a low signal; and if there is a low signal at said digital input, said arithmetic and logic unit opening said second switch in a predeterminable time range and thereby interrupting the flow of current through the load.

5. The apparatus according to claim 4, wherein said first current source is a voltage-dependent current source.

6. The apparatus according to claim 4, wherein said second current source comprises an operational amplifier having a first input connected to the measurement line, a second input connected to a constant voltage source, and an output, a first switch connected to said output of said operational amplifier and between said output line and ground, said operational amplifier comparing the voltage on the measurement line with a reference voltage of the constant voltage source and opening the first switch if the voltage on the measurement line is lower than the reference voltage, and closing the first switch if the voltage on the measurement line is higher than the reference voltage.

7. The apparatus according to claim 6, wherein the load is an ignition coil protected against overcurrent by said arithmetic and logic unit.

* * * * *